(12) United States Patent
Kim

(10) Patent No.: US 8,274,135 B2
(45) Date of Patent: Sep. 25, 2012

(54) FUSE OF SEMICONDUCTOR DEVICE

(75) Inventor: Sang Heon Kim, Seoul (KR)

(73) Assignee: Hynix Semiconductor Inc., Icheon (KR)

(*) Notice: Subject to any disclaimer, the term of this patent is extended or adjusted under 35 U.S.C. 154(b) by 298 days.

(21) Appl. No.: 12/648,259

(22) Filed: Dec. 28, 2009

(65) Prior Publication Data
US 2010/0327401 A1    Dec. 30, 2010

(30) Foreign Application Priority Data

Jun. 30, 2009  (KR) .................. 10-2009-0059484

(51) Int. Cl.
*H01L 23/52* (2006.01)

(52) U.S. Cl. . 257/529; 257/209; 257/210; 257/E23.149; 257/E23.15

(58) Field of Classification Search .................. None
See application file for complete search history.

(56) References Cited

U.S. PATENT DOCUMENTS

| | | | | |
|---|---|---|---|---|
| 6,064,095 | A  * | 5/2000 | Fu ................................ | 257/355 |
| 6,448,626 | B1 * | 9/2002 | Yoon ............................. | 257/529 |
| 6,682,959 | B2 * | 1/2004 | Bang et al. .................... | 438/132 |
| 6,841,425 | B2 * | 1/2005 | Lee et al. ...................... | 438/132 |
| 2005/0218477 | A1 * | 10/2005 | Takewaki et al. ............. | 257/531 |
| 2006/0046354 | A1 * | 3/2006 | Kreipl ........................... | 438/132 |

FOREIGN PATENT DOCUMENTS

| KR | 100245302 B1 | 11/1999 |
|---|---|---|
| KR | 1020040008707 A | 1/2004 |
| KR | 1020060011575 A | 2/2006 |
| KR | 1020070002738 A | 1/2007 |

* cited by examiner

*Primary Examiner* — Benjamin Sandvik
*Assistant Examiner* — Leslie Pilar Cruz

(57) ABSTRACT

The present invention relates to a fuse for a semiconductor device, and discloses the technique capable of preventing fuse damage, which might occur during a fuse blowing step, with reducing area of the fuse occupying the semiconductor device. The present invention includes a common source region, wherein a plurality of fuses are radially arranged about the common source region, and a fuse box wall is formed outside the fuses.

15 Claims, 8 Drawing Sheets

FUSE OF SEMICONDUCTOR DEVICE

CROSS-REFERENCE TO RELATED APPLICATION

The present application claims priority to Korean patent application No. 10-2009-0059484, filed on 30 Jun. 2009, which is incorporated by reference in its entirety.

BACKGROUND OF THE INVENTION

The present invention relates to a semiconductor device, and more particularly, to a fuse which is included in a highly integrated semiconductor device.

Generally, a fuse is defined as a type of an automatic circuit breaker which is used to prevent over-current from continuously flowing through an electric line. That is, a fuse melts itself with heat generated by the over-current to cut off the electric line, which can be easily found in common electrical appliances.

A fuse allows current to keep flowing during normal operation. However, once a fuse is cut off, it permanently interrupts the flow of electric current until it is replaced with a brand new one. This differentiates the fuse from a switch which is capable of controlling whether to let current flow or not.

A semiconductor device is manufactured by injecting dopants into a certain region in a silicon wafer or by depositing a new material on it in order to operate by its intended purpose.

A typical example includes a semiconductor memory device. Also, a semiconductor device can include a transistor, capacitor, resistor, and many other components as well as a fuse to perform its intended functions.

A fuse is used in various parts of a semiconductor memory device, for example, a redundancy circuit, a power supply circuit and the like. Fuses used in such circuits are made normal (i.e., unblown) during a manufacturing process, but after that, they can be selectively blown (i.e., cut) during a testing process.

For example, to illustrate more precisely a redundancy circuit, it is subjected to a recovery step to replace some defective unit cells in the semiconductor memory device with redundant cells.

If an address to access a defective unit cell is inputted from outside, the recovery step allows a redundant cell to be accessed instead of the defective unit cell, and stores an address of the defective unit cell to prevent access to the defective unit cell.

The most commonly used component in this recovery step is a fuse. A fuse is cut off permanently by irradiating a laser on the corresponding fuse in a semiconductor device and blowing it. This process is so called "fuse-blowing."

A semiconductor memory device includes a plurality of unit cells, and it is impossible to identify which unit cell might be defective before a manufacturing process. Thus, a fuse box having a plurality of fuses is included in a semiconductor memory device to replace any defective unit cell within a semiconductor memory device with a redundant cell.

Data storage capacity of a semiconductor memory device is increased more and more. Consequently, the number of unit cells included in the semiconductor memory device is increased, so that the number of fuses is also increased.

On the other hand, a higher degree of integration is required as the entire area of a semiconductor device is reduced. As described above, some of fuses are physically "blown" by selectively irradiating a laser thereon. Therefore, fuses must be separated from each other with a given space to protect neighboring fuses from being unintentionally blown by a laser. However, this may cause the degree of integration in a semiconductor memory device to be lowered.

FIGS. 1 and 2 are views illustrating a fuse in a conventional semiconductor device.

DRAM uses a redundancy cell for replacing defects of a main cell by blowing fuses. Fuses for use in the prior art are formed in a row inside a rectangular fuse box 1 as shown in FIGS. 1 and 2. In addition, the fuses 2 are cut by irradiating a laser on the corresponding fuses 2.

At this time, in the prior art, laser energy is used for cutting a fuse. However, in this process, diffused reflected laser or explosion of the target fuse can cause damage to adjacent fuses, which may lead to defects of these fuses.

Also, after chips are mounted on a substrate and electrically connected to the substrate, a semiconductor package is sealed by epoxy molding compound (EMC) to protect the chips and the substrate.

However, there is a problem that fuses may collapse or crack due to the stress from applying EMC or other package coating material in a subsequent packaging process.

BRIEF SUMMARY OF THE INVENTION

To solve the problems described above, the present invention has purposes as follows.

The first purpose is to reduce entire area of fuses occupying a semiconductor device by circularly forming a fuse box wall, wherein fuses are radially arranged within the fuse box.

The second purpose is to prevent fuse crack caused by stress or coating materials during a subsequent packaging process by circularly forming the fuse box wall.

The third purpose is to prevent damage and collapse of neighboring fuses, which may occur in the fuse-blowing process, by radially arranging fuses in the fuse box.

The fourth purpose is to minimize area of fuses occupying a fuse box by forming a common source region in the center of the fuse box.

To achieve the purposes above, a fuse of a semiconductor device in the present invention includes; a common source region; fuses radially arranged about the common source region; and a fuse box wall formed outside the fuses.

The fuse box wall above is circularly formed.

The fuse of the present invention further includes a plurality of metal contacts, wherein the metal contacts are connected with the fuses and are radially arranged.

The plurality of metal contacts are formed in pairs, wherein the pairs of metal contacts are separated from each other with a given space.

The size of the common source region is larger than that of a pair of metal contacts.

The plurality of fuses are at the same acute angle to adjacent fuses and are separated from each other with a given space.

The fuse of the present invention further includes a protection film which is circularly formed within the fuse box.

The plurality of fuses has each blowing point positioned on a spot which is not close to a common source region.

BRIEF DESCRIPTION OF THE DRAWINGS

Reference will now be made to the drawings, which describe embodiments of the invention in detail, and in which.

DESCRIPTION OF EMBODIMENT

FIGS. 3 through 6 are top views illustrating a fuse in a semiconductor device according to an embodiment of the present invention.

Figure 1:
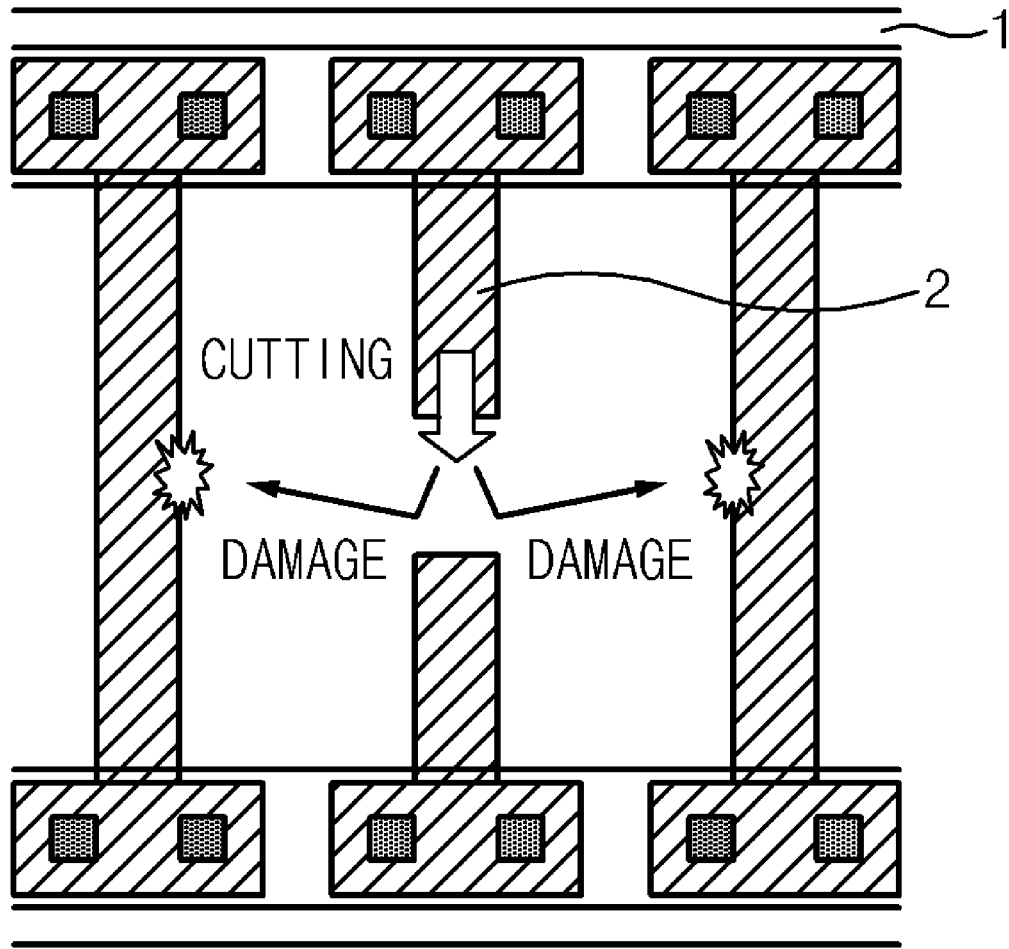
FIGS. 1 and 2 are views illustrating a fuse in a conventional semiconductor device.
Figure 2:
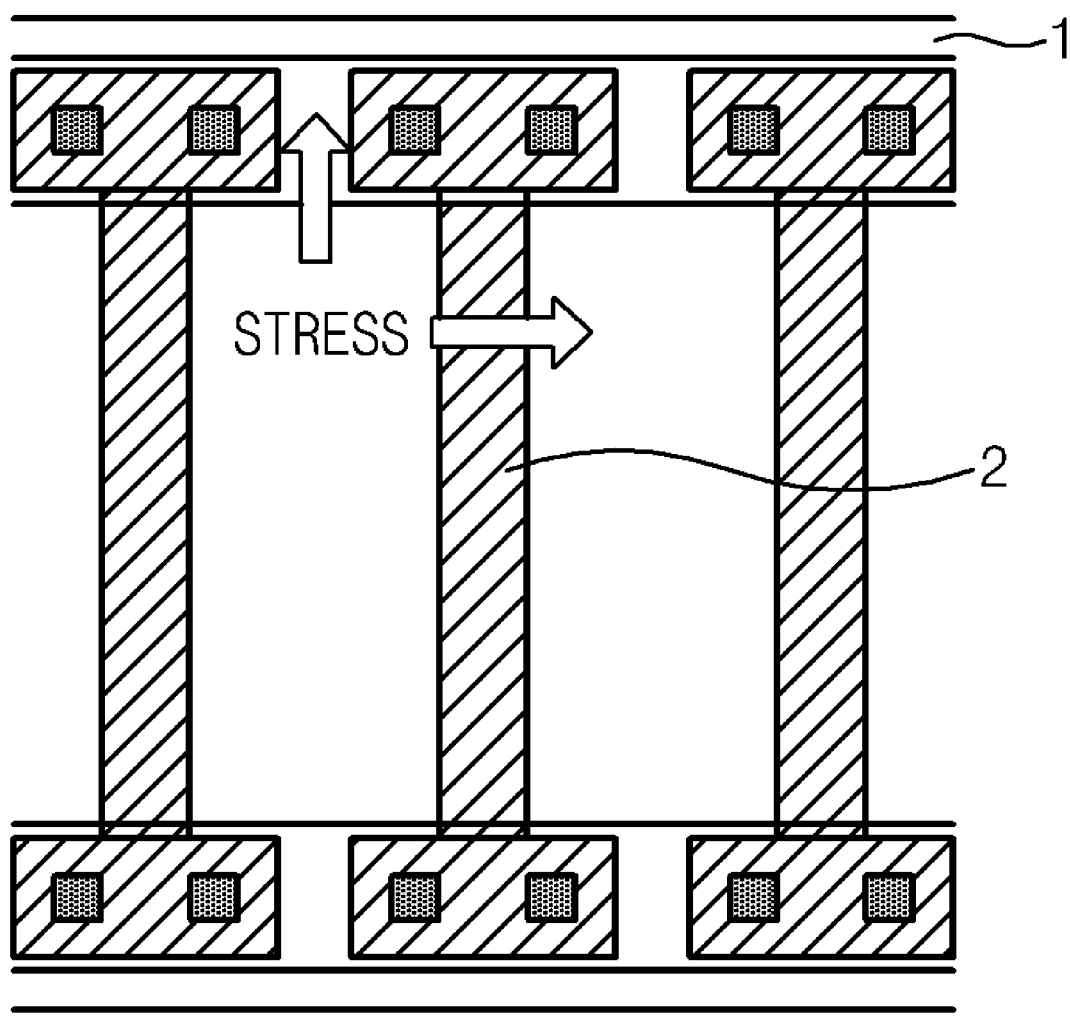
Figure 3:
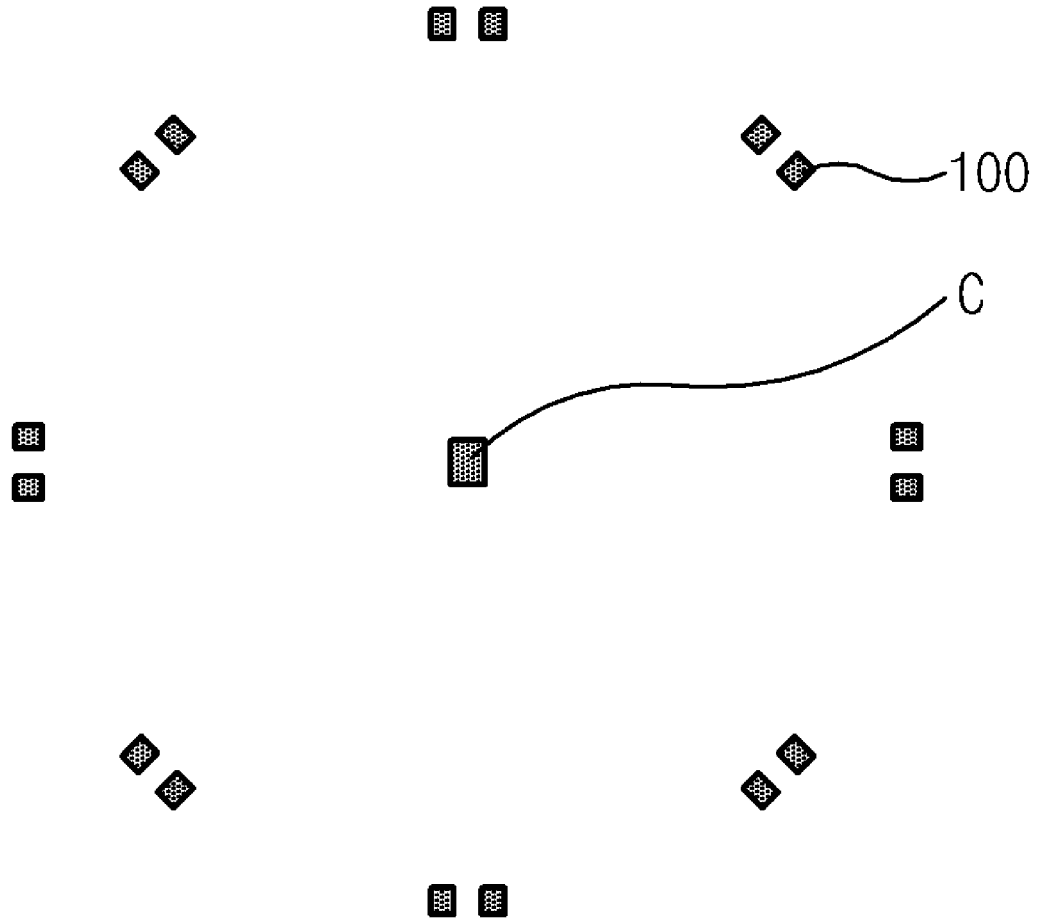
FIGS. 3 through 6 are top views illustrating a fuse in a semiconductor device according to an embodiment of the present invention.

First of all, as shown in FIG. 3, metal contacts 100 described below are circularly formed to be connected to a fuse. Metal contacts 100 are formed in pairs, wherein pairs of metal contacts 100 are separated from each other with the same space.

In addition, a common contact region C is formed in the center of a fuse box, in which fuses described below are commonly crossed. Here, the common contact region C is where the fuses described below are connected in common such that the size of the common contact region can be larger than that of the metal contact 100 to secure the process margin.

Figure 4:
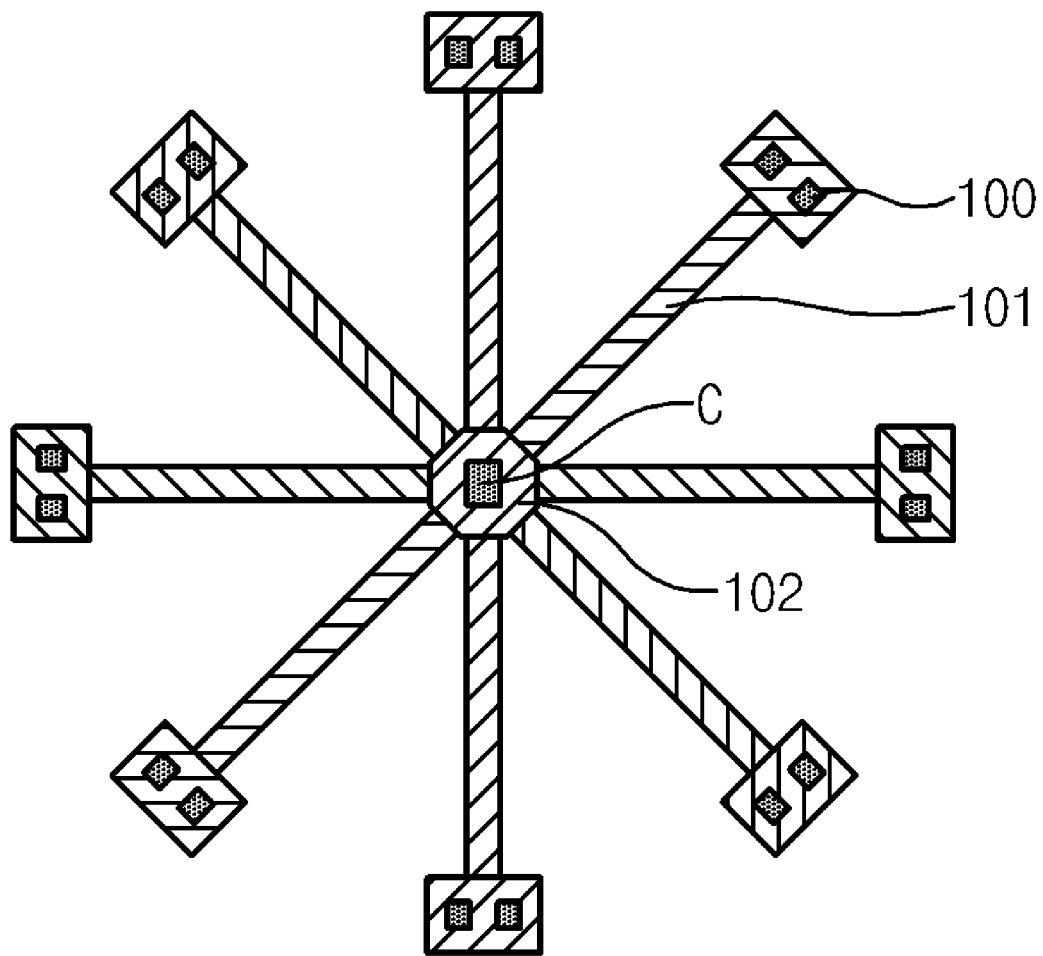

Moreover, as shown in FIG. 4, fuses 101 are radially formed over the metal contacts 100 in order to be connected to the metal contacts 100. A common source region 102 is formed in the common contact region C such that one end of each fuse 101 is cross-connected to the common source region 102. That is, in the present invention, the plurality of fuses 101 are radially arranged about the common contact region C.

Each of fuses 101 is separated from adjacent fuses with the same space as well as the same angle to adjacent fuses. Especially, each blowing region to be physically damaged by irradiating with a laser is separated from adjacent blowing regions with a minimum gap not to affect other blowing regions or connection lines by physical blowing.

Accordingly, a process margin for cutting energy can be secured in a subsequent fuse cutting process. That is, although fuse blowing is performed by irradiating a laser on the blowing region of each fuse 101 to blow the fuse 101, a minimum gap can be kept between the fuses 101 to secure reliability of operation.

In addition, in a subsequent packaging process, the present invention does not allow stress by coating materials to affect fuses 101. Furthermore, fuses 101 are radially arranged, being separated from adjacent fuses 101 with a given space such that fuses 101 can be prevented from collapsing and cracking.

Figure 5:
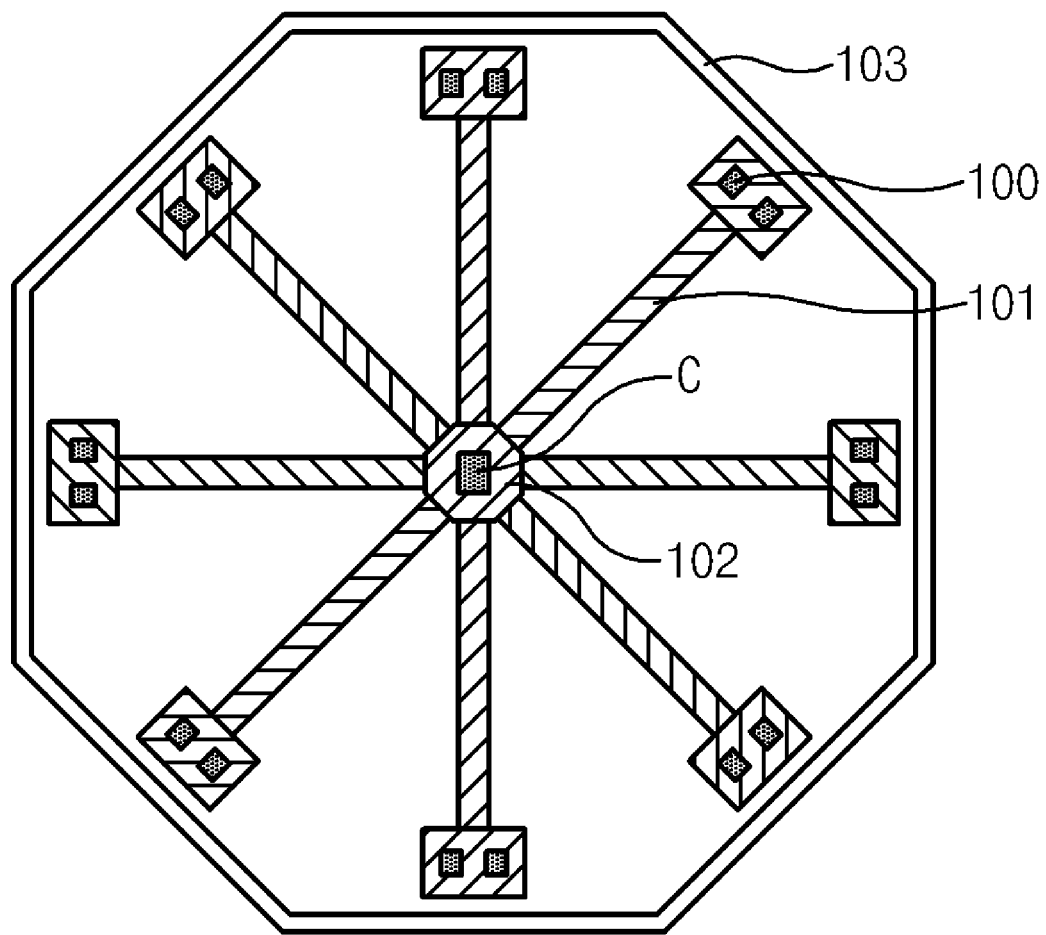

Also, as shown in FIG. 5, a fuse box wall 103 having an enclosed shape is formed outside the fuses 101. The fuse box wall 103 defines a fuse box, where the fuse box includes components provided within the fuse box wall 103. The fuse box wall 103 is configured to endure stress occurring when applying EMC (epoxy molding compound) and coating materials for protecting chips and wires in a subsequent packaging process.

Here, fuse box wall 103 according to an embodiment of the present invention is octagon-shaped to correspond to the number of pairs of metal contacts 100, however should not be construed as limiting the scope of the present invention. The fuse box wall 103 is desirable for the present invention to have various circle-like (or circular) structures including an octagonal shape.

Figure 6:
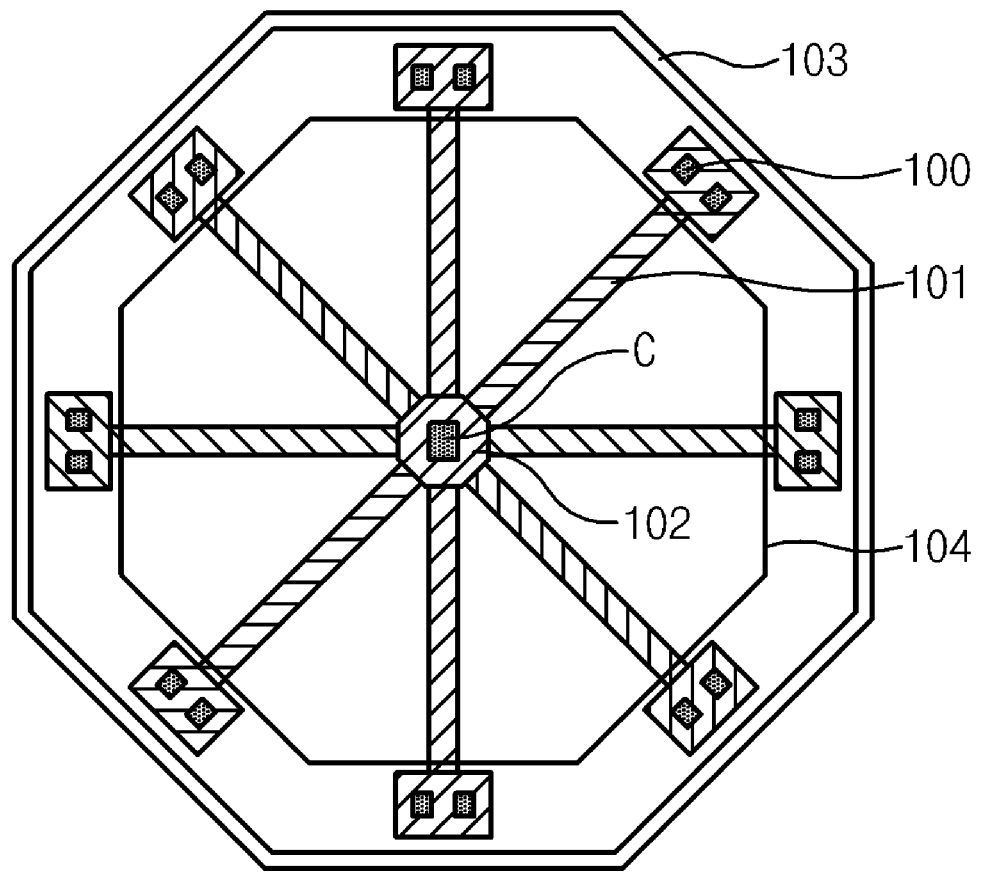

In addition, as shown in FIG. 6, a protection film 104 is formed on fuse box wall 103. This protection film 104 is smaller than fuse box wall 103, and is circularly shaped with the same shape as the fuse box wall 103. The protection film 104 is formed in the fuse box wall 103 to protect regions other than open regions of the fuses 101.

Figure 7A:
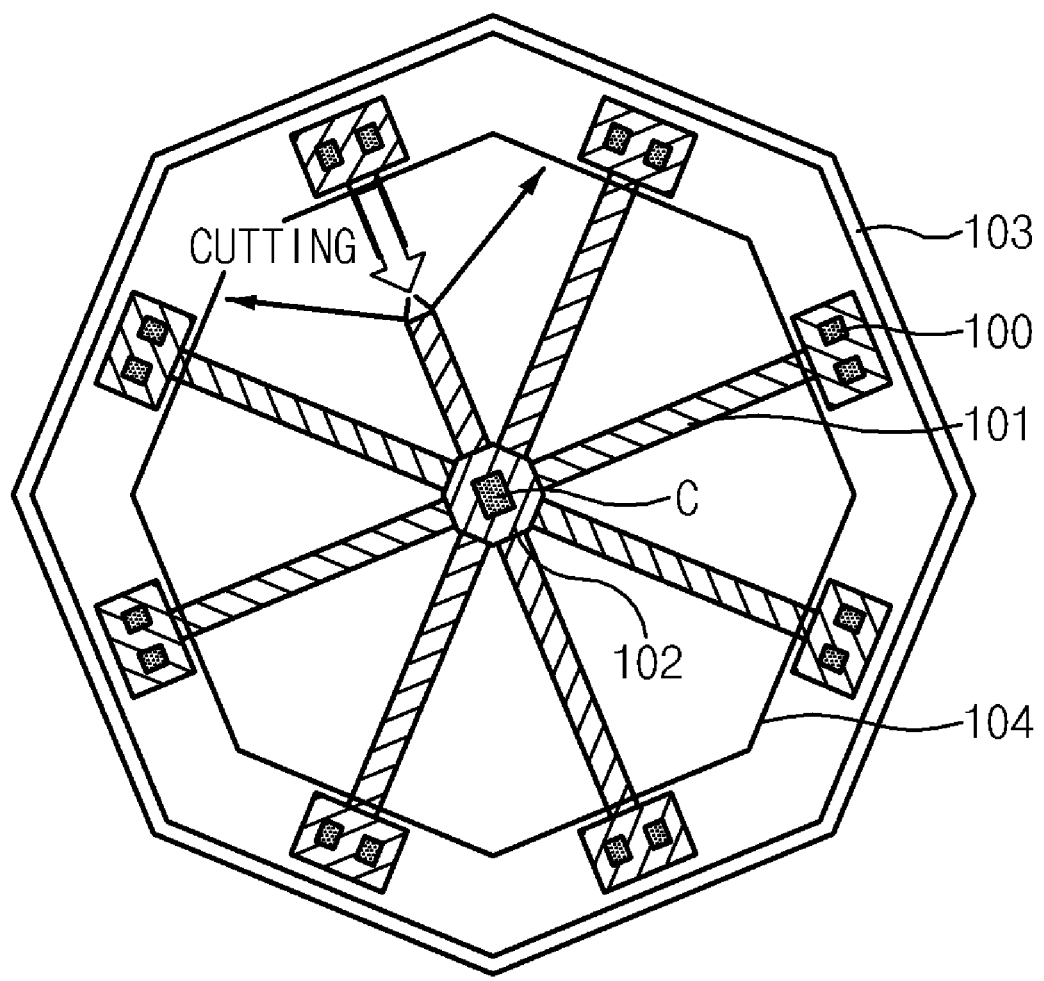
FIGS. 7a and 7b are views illustrating effects of a fuse according to an embodiment of the present invention.
Figure 7B:
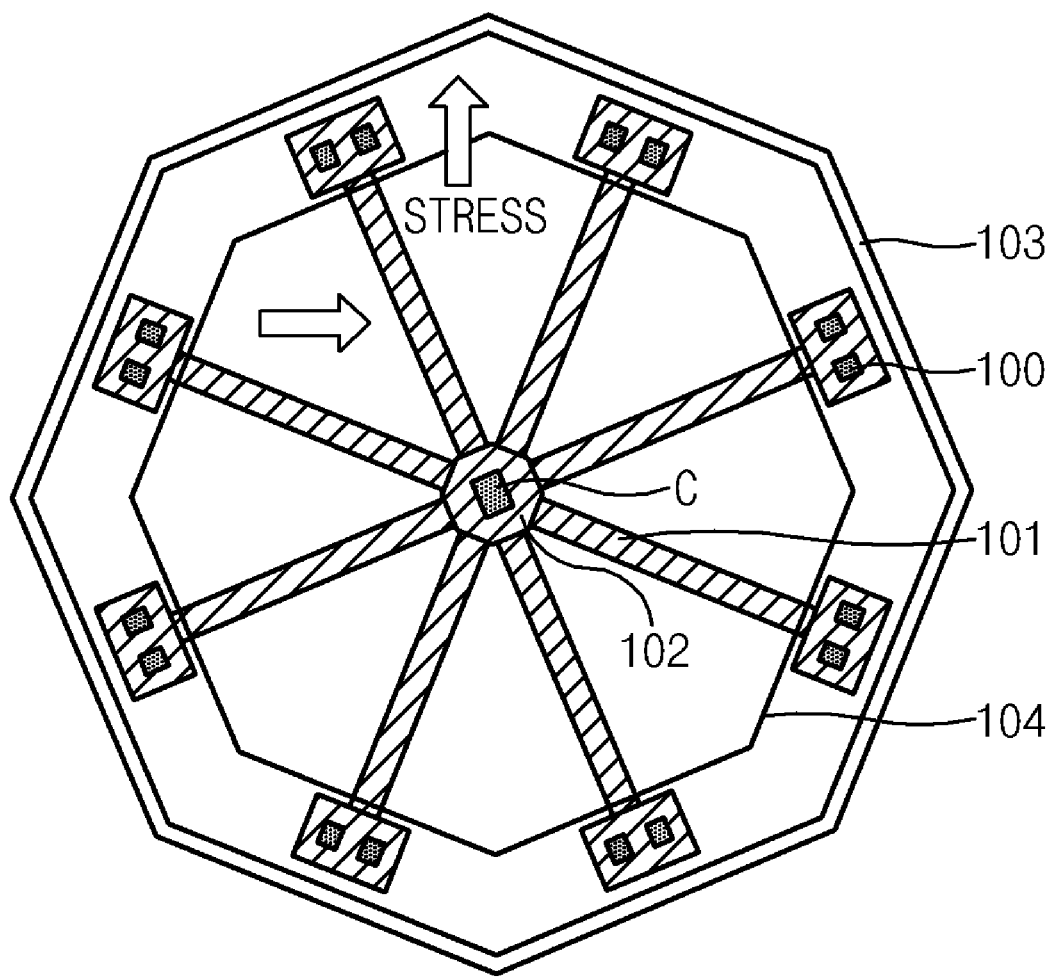

FIGS. 7a and 7b are views illustrating effects of a fuse according to an embodiment of the present invention.

In the present invention, fuses 101 are radially arranged to be separated from each other with a given space and be at the same angle to adjacent fuses. In this case, space margins between adjacent fuses are fully secured.

Thus, fuses 101 to be cut can not affect adjacent fuses 101 thereto. Therefore, as shown in FIG. 7a, the space margin between fuses 101 prevents damage to adjacent fuses 101 by protecting adjacent fuses 101 from diffused reflected laser or explosion of the target fuse, which may occur during a fuse cutting process.

Moreover, as shown in FIG. 7b, a fuse box wall 103 is circularly formed, so that it can better endure stress occurring when applying EMC and coating materials during a subsequent packaging process. In addition, fuses 101 are at the same angle to adjacent fuses 101, so that a fuse blowing process does not affect adjacent fuses 101.

Also, in the present invention, as a blowing spot of each fuse 101 is getting far from the common source region 102, the space margin between adjacent fuses can be secured more reliably. Thus, margin of cutting energy is greatly secured to reduce defects of non-cutting.

In addition, the plurality of fuses 101 according to the present invention are extending radially from a common source region 102 to reduce entire fuse area in a semiconductor device compared with conventional I-shaped fuses arranged independently in parallel to each other.

First, the present invention is free from thermal deterioration during a fuse blowing process to secure a reliable cutting operation by circularly forming a fuse box wall and radially arranging fuses in the fuse box.

Second, the present invention reduces area of fuses occupying a semiconductor device by circularly forming the fuse box wall and radially arranging the fuses in the fuse box.

Third, the present invention reduces fuse cracks from occurring by generated stress from coating materials in a subsequent packaging process.

Fourth, the present invention reduces adjacent fuses from being damaged from collapse during a fuse blowing process by radially arranging the fuses in the fuse box.

Fifth, the present invention minimizes area of the fuses by forming a common source region in the center of the fuse box.

The above-described embodiments of the present application are intended to be examples only. Alterations, modifications and variations may be effected to the particular embodiments by those skilled in the art without departing from the scope of the application, which is defined by the claims appended hereto.

What is claimed is:

1. A semiconductor device having a fuse box, the fuse box comprising:
   a common source region;
   a plurality of fuses extending radially from the common source region, the plurality of fuses comprising at least a first fuse, a second fuse, and a third fuse, each fuse having a first end coupled to the common source region and a second end located at an opposing side of the first end; and
   a fuse box wall provided proximate to the second ends of the plurality of fuses.

2. The fuse box of claim 1, wherein the fuse box wall has an enclosed shape, the fuse box wall enclosing the plurality of fuses.

3. The fuse box of claim 1, wherein the fuse box wall has eight sides.

4. The fuse box of claim 1, wherein each of two adjacent fuses in the plurality of fuses define substantially the same angle.

5. The fuse box of claim 1, wherein each of the plurality of fuses is separated from an adjacent fuse by substantially the same distance.

6. The fuse box of claim 1, wherein a blowing region of the plurality of fuses is closer to the second end than the first end of the fuse.

7. The fuse box of claim 1, further comprising a protection film formed within an area defined by the fuse box.

8. The fuse box of claim 7, wherein the protection film has substantially the same structure as the fuse box.

9. The fuse box of claim 7, wherein the protection film is circularly shaped.

10. The fuse box of claim 9, wherein the protection film has an octagonal shape.

11. The fuse box of claim 1, further comprising a plurality of conductive contacts connected to the second ends of the plurality of fuses, wherein at least one conductive contact is electrically connected to each second end, wherein the plurality of conductive contacts are circularly arranged.

12. The fuse box of claim 11, wherein two conductive contacts are electrically connected to each second end.

13. The fuse box of claim 12, wherein a area of the common source region is larger than that of the two conductive contacts.

14. The fuse box of claim 1, further comprising a common contact region provided in the common source region.

15. The fuse box of claim 14, wherein an area of the common source region is larger than that of the common contact region.

* * * * *